(12) United States Patent
Shibata et al.

(10) Patent No.: US 11,337,302 B2
(45) Date of Patent: May 17, 2022

(54) WIRING CIRCUIT BOARD

(71) Applicant: NITTO DENKO CORPORATION, Osaka (JP)

(72) Inventors: Shusaku Shibata, Osaka (JP); Takahiro Takano, Osaka (JP); Hiromoto Haruta, Osaka (JP); Shuichi Wakaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/755,733

(22) PCT Filed: Oct. 12, 2018

(86) PCT No.: PCT/JP2018/038084
§ 371 (c)(1),
(2) Date: Apr. 13, 2020

(87) PCT Pub. No.: WO2019/078106
PCT Pub. Date: Apr. 25, 2019

(65) Prior Publication Data
US 2021/0204398 A1 Jul. 1, 2021

(30) Foreign Application Priority Data
Oct. 18, 2017 (JP) .............................. JP2017-201623

(51) Int. Cl.
*H05K 1/02* (2006.01)
(52) U.S. Cl.
CPC ................................. *H05K 1/0266* (2013.01)

(58) Field of Classification Search
CPC .......................................... H05K 1/0266–0269
See application file for complete search history.

(56) References Cited

U.S. PATENT DOCUMENTS

| 2005/0253275 | A1* | 11/2005 | Hsu ...................... H01L 21/563 257/778 |
| 2008/0245549 | A1* | 10/2008 | Kodani ................ H05K 3/4679 174/126.1 |
| 2010/0129026 | A1 | 5/2010 | Hodono et al. |

(Continued)

FOREIGN PATENT DOCUMENTS

| JP | 2002-185102 A | 6/2002 |
| JP | 2003-304041 A | 10/2003 |

(Continued)

OTHER PUBLICATIONS

International Search Report Issued in PCT/JP2018/038084 dated Dec. 25, 2018.

(Continued)

*Primary Examiner* — Hoa C Nguyen
(74) *Attorney, Agent, or Firm* — Edwards Neils LLC; Jean C. Edwards, Esq.

(57) ABSTRACT

A wiring circuit board includes an insulating layer, a wire embedded in the insulating layer, and an alignment mark electrically independent from the wire and disposed in the insulating layer so as to allow a one-side surface in a thickness direction of the alignment mark to be exposed from the insulating layer. A peripheral portion of the alignment mark consists of only the insulating layer and has a thickness of 30 μm or less.

5 Claims, 6 Drawing Sheets

(56) References Cited

U.S. PATENT DOCUMENTS

| | | | | |
|---|---|---|---|---|
| 2010/0208437 A1* | 8/2010 | Maeda | ............... | H01L 24/81 |
| | | | | 361/760 |
| 2011/0169164 A1* | 7/2011 | Nakamura | ........... | H05K 1/0269 |
| | | | | 257/739 |
| 2013/0285079 A1* | 10/2013 | Hayashi | ............... | H05K 1/0269 |
| | | | | 257/88 |

FOREIGN PATENT DOCUMENTS

| | | | |
|---|---|---|---|
| JP | 2008-081577 | A | 4/2008 |
| JP | 2010-128200 | A | 6/2010 |
| JP | 2013-093077 | A | 5/2013 |
| JP | 2015-195233 | A | 11/2015 |
| TW | 201136481 | A1 | 10/2011 |

OTHER PUBLICATIONS

Written Opinion Issued in PCT/JP2018/038084 dated Dec. 25, 2018.

International Preliminary Report on Patentability issued by WIPO dated Apr. 21, 2020, in connection with International Patent Application No. PCT/JP2018/038084.

Office Action, which was issued by the Japanese Patent Office dated Oct. 26, 2021, in connection with Japanese Patent Application No. 2017-201623.

Office Action, which was issued by the Taiwanese Intellectual Property Office dated Nov. 10, 2021, in connection with Taiwanese Patent Application No. 107136679.

* cited by examiner

FIG. 6
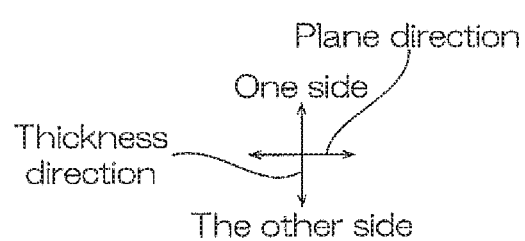
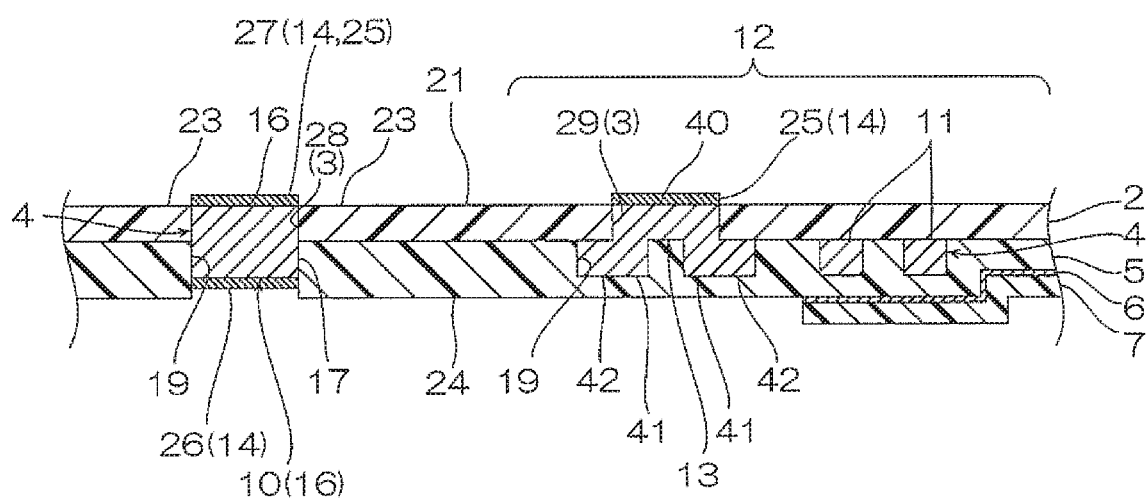

WIRING CIRCUIT BOARD

CROSS-REFERENCE TO RELATED APPLICATIONS

The present application is a 35 U.S.C. 371 National Stage Entry of PCT/JP2018/038084, filed on Oct. 12, 2018, which claims priority from Japanese Patent Application No. 2017-201623, filed on Oct. 18, 2017, the contents of all of which are herein incorporated by reference in their entirety.

TECHNICAL FIELD

The present invention relates to a wiring circuit board.

BACKGROUND ART

It has been conventionally known that in various wiring circuit boards, an alignment mark is provided, and alignment is carried out in a subsequent step by using the alignment mark.

For example, a circuit board including an insulating base; a terminal portion and an alignment mark disposed on the surface thereof; and a transparent layer covering the upper surface of the alignment mark has been proposed (ref: for example, Patent Document 1).

In Patent Document 1, light is applied from a light source provided on the rear surface side of the circuit board to the circuit board, and the light that transmits through the circuit board is received by a light receiving element provided on the front surface side, so that the position of the alignment mark is confirmed (transmission mode).

CITATION LIST

Patent Document

Patent Document 1: Japanese Unexamined Patent Publication No. 2003-304041

SUMMARY OF THE INVENTION

Problem to be Solved by the Invention

The alignment mark is required to have more excellent visibility in the above-described transmission mode.

Furthermore, the alignment mark is also required to have excellent visibility in a reflection mode in which the light is applied to the circuit board, and reflective light is produced to be received. However, in Patent Document 1, there is a disadvantage that the alignment mark is covered with the transparent layer, so that the above-described demand cannot be satisfied.

The present invention provides a wiring circuit board having excellent visibility of an alignment mark in both of a reflection mode and a transmission mode.

Means for Solving the Problem

The present invention (1) includes a wiring circuit board including an insulating layer, a wire embedded in the insulating layer, and an alignment mark electrically independent from the wire and disposed in the insulating layer so as to allow a one-side surface in a thickness direction of the alignment mark to be exposed from the insulating layer, wherein a peripheral portion of the alignment mark consists of only the insulating layer and has a thickness of 30 μm or less.

In the wiring circuit board, the one-side surface in the thickness direction of the alignment mark is exposed from the insulating layer. Thus, in a reflection mode in which light is applied from one side in the thickness direction of the alignment mark to the one-side surface in the thickness direction to detect reflective light produced on the one-side surface in the thickness direction of the alignment mark, a light amount thereof can be increased compared to the light amount of the reflective light on the one-side surface in the thickness direction of the alignment mark that is covered with the insulating layer (transparent layer). As a result, visibility of the alignment mark in the reflection mode is excellent.

In the wiring circuit board, the peripheral portion consists of only the insulating layer, and the thickness of the peripheral portion is thin of 30 μm or less. Thus, in a transmission mode in which light is applied to the peripheral portion to detect the light transmitting through the peripheral portion, transmittance of the light can be increased, and accordingly, the light amount of the transmitting light of the peripheral portion in the transmission mode can be increased. As a result, the visibility of the alignment mark in the transmission mode is excellent.

Accordingly, the wiring circuit board has excellent visibility of the alignment mark in both of the reflection mode and the transmission mode.

The present invention (2) includes the wiring circuit board described in (1), wherein the insulating layer has a through hole passing through in the thickness direction, the alignment mark is disposed at the inside of the through hole, and at least any one of the one-side surface and an other-side surface in the thickness direction is exposed from the insulating layer.

In the wiring circuit board, at least any one of the one-side surface and the other-side surface in the thickness direction of the alignment mark is exposed, so that the visibility of the alignment mark in the reflection mode is excellent.

The present invention (3) includes the wiring circuit board described in (1) or (2) further including a terminal electrically connected to the wire, wherein the insulating layer includes a base insulating layer; the base insulating layer has a first through hole and a second through hole passing through in the thickness direction and disposed at spaced intervals to each other; the alignment mark includes a mark main body portion disposed at the inside of the first through hole, a mark inner-side portion disposed at the other side in the thickness direction of the mark main body portion, and a mark outer-side portion disposed on the other-side surface in the thickness direction of the base insulating layer so as to be continuous from the mark inner-side portion and independent from the terminal; and the terminal includes a terminal main body portion disposed at the inside of the second through hole, a terminal inner-side portion disposed at the other side in the thickness direction of the terminal main body portion, and a terminal outer-side portion disposed on the other-side surface in the thickness direction of the base insulating layer so as to be continuous from the terminal inner-side portion and electrically connected to the wire.

In the wiring circuit board, the alignment mark includes the mark main body portion, the mark inner-side portion, and the mark outer-side portion in the above-described structure, and the terminal includes the terminal main body portion, the terminal inner-side portion, and the terminal outer-side portion in the above-described structure, so that the alignment mark and the terminal can have the same structure. As a result, position accuracy of the alignment mark with respect to the terminal is high, and alignment accuracy of a mounting component with respect to the terminal by the alignment mark can be improved.

The present invention (4) includes the wiring circuit board described in (3), wherein the shortest distance between the alignment mark and the terminal is 3 mm or less.

In the wiring circuit board, the shortest distance between the alignment mark and the terminal is short of 3 mm or less, so that the alignment accuracy of the mounting component with respect to the terminal by the alignment mark is excellent.

The present invention (5) includes the wiring circuit board described in any one of (1) to (4), wherein the arithmetic average roughness Ra of the one-side surface in the thickness direction of the peripheral portion is 0.04 μm or more.

In the wiring circuit board, the arithmetic average roughness Ra of the one-side surface in the thickness direction of the peripheral portion is large of 0.04 μm or more, so that when the light is applied from one side in the thickness direction of the peripheral portion, the light is scattered on the rough one-side surface in the thickness direction of the peripheral portion, and the light amount of the reflective light can be reduced. Thus, the visibility of the alignment mark in the reflection mode is excellent.

The present invention (6) includes the wiring circuit board described in any one of (1) to (5), wherein the arithmetic average roughness Ra of the one-side surface in the thickness direction of the peripheral portion is below 0.15 μm.

In the wiring circuit board, the arithmetic average roughness Ra of the one-side surface in the thickness direction of the peripheral portion is small of below 0.15 μm, so that a thin mounting component can be accurately mounted on the flat one-side surface in the thickness direction of the wiring circuit board.

Effect of the Invention

The wiring circuit board of the present invention has excellent visibility of the alignment mark in both of the reflection mode and the transmission mode.

BRIEF DESCRIPTION OF THE DRAWINGS

FIG. 3A illustrating a reflection mode of applying light from one side in a thickness direction, FIG. 3B illustrating a reflection mode of applying the light from the other side in the thickness direction, and FIG. 3C illustrating a transmission mode of applying the light from the other side in the thickness direction.

FIG. 6 shows a cross-sectional view of a modified example of a wiring circuit board of the present invention.

DESCRIPTION OF EMBODIMENTS

Figure 2:
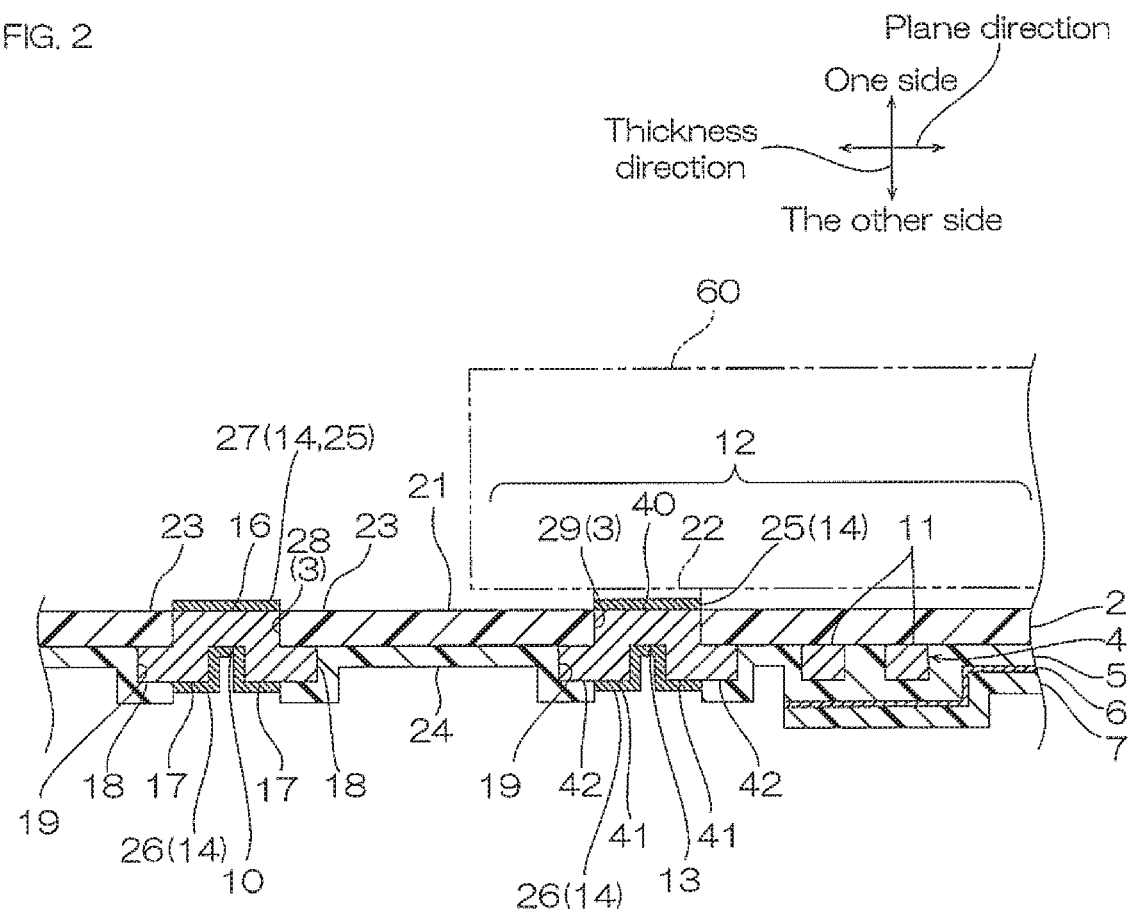
FIG. 2 shows a cross-sectional view of the wiring circuit board shown in FIG. 1.

In FIG. 2, the up-down direction on the plane of the sheet is an up-down direction (one example of a thickness direction), the upper side on the plane of the sheet is an upper side (one example of one side in the thickness direction), and the lower side on the plane of the sheet is a lower side (one example of the other side in the thickness direction). The right-left direction on the plane of the sheet is a plane direction (one example of a direction perpendicular to the thickness direction).

To be specific, directions are in conformity with direction arrows described in each view.

The definition of the directions does not mean to limit the directions at the time of the production and the use of a wiring circuit board 1.

One Embodiment

Figure 1:
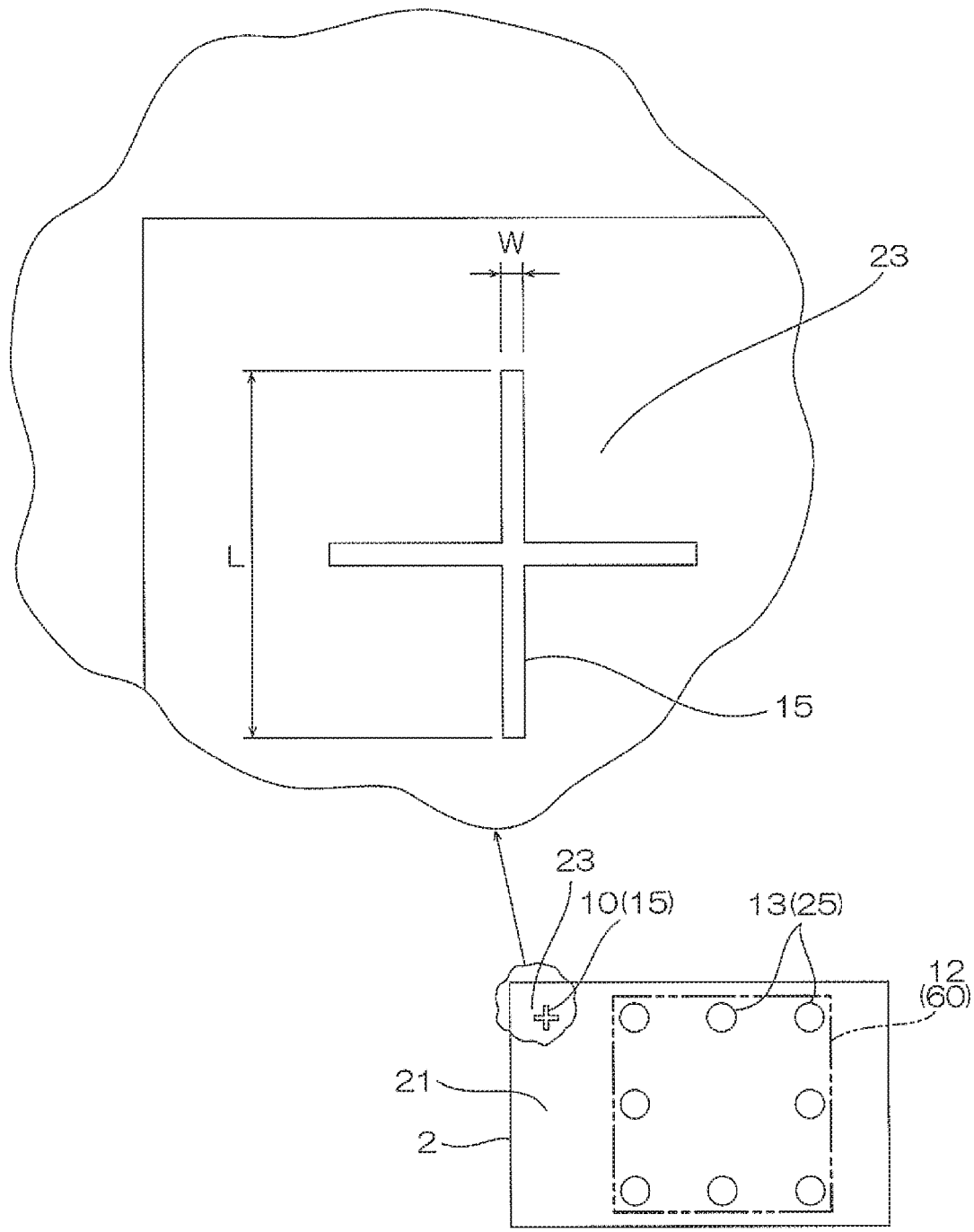
FIG. 1 shows a plan view of a one embodiment of a wiring circuit board of the present invention.

As shown in FIGS. 1 and 2, the wiring circuit board 1 of a one embodiment is mounted with a mounting component 60 (ref: a phantom line), and provided in various devices (not shown). Also, the wiring circuit board 1 is, for example, a wiring circuit board for mounting on which the mounting component 60 (phantom line) is mounted by using an alignment mark 15 to be described later in both modes of a reflection mode and a transmission mode.

The wiring circuit board 1 has a generally rectangular sheet shape extending in the plane direction (direction perpendicular to the thickness direction). The wiring circuit board 1 includes a plurality of terminals 13 disposed at the inside in the plane direction of a mounting region 12 and the alignment mark 15 disposed at the outside in the plane direction of the mounting region 12.

The mounting region 12 is a region in a generally rectangular shape when viewed from the top in which the mounting component 60 is to be mounted on a one-side surface in the thickness direction of the wiring circuit board 1.

The plurality of terminals 13 are disposed at spaced intervals to each other at the inside of the mounting region 12. Each of the plurality of terminals 13 has, for example, a generally circular shape when viewed from the top. Each of the plurality of terminals 13 has the maximum length (to be specific, a diameter) in the plane direction of, for example, 5 μm or more, preferably 10 μm or more, and for example, 1000 μm or less, preferably 500 μm or less.

The one alignment mark 15 is, for example, provided corresponding to the one mounting region 12. The alignment mark 15 has, for example, a generally cross shape (cross-shaped) when viewed from the top. The alignment mark 15 has the maximum length L (to be specific, the maximum length L in two sides that configure the cross) in the plane direction of, for example, 1 mm or less, preferably, 0.5 mm or less, more preferably 0.3 mm or less, and for example, 0.05 mm or more. When the maximum length L of the alignment mark 15 is the above-described upper limit or less, alignment accuracy can be improved.

When the maximum length L of the alignment mark 15 is small of 1 mm or less, it is difficult to accurately recognize the alignment mark 15. However, a ratio of reflective light amount (described later) is set large, so that the above-described difficulty can be overcome.

The alignment mark 15 has a width W (line width W of each of the sides) of, for example, 300 μm or less, preferably 200 μm or less, more preferably 100 μm or less, and for example, 10 μm or more. When the width W of the alignment mark 15 is the above-described upper limit or less, the alignment accuracy can be improved.

A peripheral portion 23 of the alignment mark 15 is near the alignment mark 15, and is a portion excluding the alignment mark 15. The peripheral portion 23 is positioned at the outside of the mounting region 12. The peripheral portion 23 is a region within a range of, for example, 10 mm or less, preferably 5 mm or less from the center (intersection point of the two sides when the alignment mark 15 has a generally cross shape when viewed from the top) of the alignment mark 15.

The wiring circuit board 1 includes a base insulating layer 2 as one example of an insulating layer, a conductive layer 4, an intermediate insulating layer 5 as one example of an insulating layer, a shield layer 6, a cover insulating layer 7, and a metal protective layer 14.

The base insulating layer 2 has a generally rectangular sheet shape extending in the plane direction. The base insulating layer 2 has a one-side surface 21 in the thickness direction exposed toward one side in the thickness direction and an other-side surface in the thickness direction in parallel with the one-side surface 21 in the thickness direction. The base insulating layer 2 has a plurality of base opening portions 3 passing through in the thickness direction. A material for the base insulating layer 2 is an insulating material. Examples of the insulating material include synthetic resins (transparent resins) such as polyimide, polyamide imide, acryl, polyether nitrile, polyether sulfone, polyethylene terephthalate, polyethylene naphthalate, and polyvinyl chloride. Preferably, polyimide is used. That is, the base insulating layer 2 is preferably a polyimide layer. The base insulating layer 2 has a thickness of, for example, 1 µm or more, preferably 5 µm or more, and for example, 30 µm or less, preferably 10 µm or less.

The arithmetic average roughness Ra of the one-side surface 21 in the thickness direction of the base insulating layer 2 in the peripheral portion 23 is, for example, 0.04 µm or more, preferably 0.07 µm or more. The arithmetic average roughness Ra is defined and measured in JIS B 0601:2013. The definition and a measurement method of the arithmetic average roughness Ra to be described later are the same as the description above. When the arithmetic average roughness Ra of the one-side surface 21 in the thickness direction of the base insulating layer 2 is the above-described lower limit or more, the one-side surface 21 in the thickness direction of the base insulating layer 2 can be set rough, and thus, in a second step (described later), when light is applied from one side in the thickness direction, a second reflective light RL2 is scattered, and a light amount thereof can be reduced.

The arithmetic average roughness Ra of the one-side surface 21 in the thickness direction of the base insulating layer 2 in the peripheral portion 23 is, for example, below 0.15 µm, preferably 0.13 µm or less. Meanwhile, the one-side surface 21 in the thickness direction of the base insulating layer 2 in the peripheral portion 23 has the maximum height Rz (JIS B 0601:2013) of, for example, 2 µm or less, preferably 1 µm or less.

When the arithmetic average roughness Ra and/or the maximum height Rz of the one-side surface 21 in the thickness direction of the base insulating layer 2 are/is below the above-described upper limit, the thin mounting component 60 can be accurately mounted on the flat one-side surface in the thickness direction (the mounting region 12) in the wiring circuit board 1.

The arithmetic average roughness Ra and/or the maximum height Rz of the one-side surface 21 in the thickness direction of the base insulating layer 2 are/is limited to the peripheral portion 23. Alternatively, for example, the one-side surface 21 in the thickness direction of the peripheral portion 23 and furthermore, the portion around the peripheral portion 23 (that is, a region other than the peripheral portion 23) may be also used.

The plurality of base opening portions 3 are disposed at spaced intervals to each other. Each of the base opening portions 3 has a shape corresponding to a mark main body portion 16 and a terminal main body portion 40 to be described later. To be specific, the base opening portion 3 has a generally circular shape when viewed from the top. The base opening portion 3 corresponding to the mark main body portion 16 is a first through hole 28, and the base opening portion 3 corresponding to the terminal main body portion 40 is a second through hole 29. The first through hole 28 and the second through hole 29 are disposed at spaced intervals to each other in the plane direction.

The conductive layer 4 includes a mark portion 10, a wire 11, and the terminal 13.

The mark portion 10 is included in the one alignment mark 15 to be described later. The mark portion 10 is provided independently (to be more specific, insulated) from the wire 11. The mark portion 10 integrally includes the mark main body portion 16, a mark inner-side portion 17, and a mark outer-side portion 18.

The mark main body portion 16 fills the inside of the base opening portion 3. The one-side surface in the thickness direction of the mark main body portion 16 is flush with the one-side surface 21 in the thickness direction of the base insulating layer 2.

The mark inner-side portion 17 is disposed at the lower side of the peripheral end portion of the mark main body portion 16.

The mark outer-side portion 18 is disposed on the lower surface of the base insulating layer 2 so as to be continuous from the mark inner-side portion 17. The mark outer-side portion 18 is expanded outwardly from the peripheral end edge of the mark inner-side portion 17. In this manner, the mark portion 10 has a generally hat shape when viewed in cross section having an opening toward the other side in the thickness direction. The mark outer-side portion 18 is independent from the terminal 13 and the wire 11.

The lower surface of the mark inner-side portion 17 is flush with that of the mark outer-side portion 18. The mark inner-side portion 17 and the mark outer-side portion 18 have a thickness of, for example, 1 µm or more, preferably 3 µm or more, and for example, 15 µm or less, preferably 10 µm or less.

Although not shown, the wire 11 is electrically connected to the terminal 13 to be described next. The plurality of wires 11 are provided corresponding to the plurality of terminals 13 (ref: FIG. 1), and disposed at spaced intervals to each other. One end of the wire 11 is electrically connected to the above-described terminal 13, and the other end thereof is electrically connected to an external terminal (external terminal provided in an external device) that is not shown. The wire 11 is embedded in the insulating layers (the base insulating layer 2 and the intermediate insulating layer 5).

As described above, the terminal 13 has a generally circular shape when viewed from the top. The terminal 13 integrally includes the terminal main body portion 40, a terminal inner-side portion 41, and a terminal outer-side portion 42.

The terminal main body portion 40 fills the inside of the base opening portion 3. The one-side surface in the thickness direction of the terminal main body portion 40 is flush with the one-side surface 21 in the thickness direction of the base insulating layer 2.

The terminal inner-side portion 41 is disposed at the lower side of the peripheral end portion of the terminal main body portion 40.

The terminal outer-side portion 42 is disposed on the lower surface of the base insulating layer 2 so as to be continuous from the terminal inner-side portion 41. The terminal outer-side portion 42 is expanded outwardly from the peripheral end edge of the terminal inner-side portion 41. In this manner, the terminal 13 has a generally hat shape when viewed in cross section having an opening toward the other side in the thickness direction. The terminal outer-side portion 42 is continuous to one end of the wire 11. The lower surface of the terminal inner-side portion 41 is flush with that of the terminal outer-side portion 42.

The thickness of the terminal inner-side portion 41 and the terminal outer-side portion 42 is the same as that of the mark inner-side portion 17 and the mark outer-side portion 18.

Accordingly, the terminal 13 has the same layer structure as that of the mark portion 10.

The shortest distance between the terminal 13 and the alignment mark 15 is, for example, 3 mm or less, preferably 2.5 mm or less, more preferably 2 mm or less, and for example, 0.1 mm or more. When the shortest distance is the above-described upper limit or less, the alignment accuracy of the mounting component 60 with respect to the terminal 13 by the alignment mark 15 is excellent.

Examples of a material for the conductive layer 4 include metal materials such as copper, silver, gold, and nickel, and an alloy thereof, and solder. Preferably, copper is used.

The intermediate insulating layer 5 is disposed on the other-side surface in the thickness direction of the base insulating layer 2 so as to cover the other-side surface and the side surfaces in the thickness direction of the mark outer-side portion 18, the terminal outer-side portion 42, and the wire 11.

The intermediate insulating layer 5 has a plurality of intermediate opening portions 19 passing through in the thickness direction. The intermediate opening portions 19 are provided corresponding to the plurality of base opening portions 3. Each of the plurality of intermediate opening portions 19 is communicated with each of the plurality of base opening portions 3 in the thickness direction. The intermediate opening portion 19 exposes the other-side surface in the thickness direction of the mark main body portion 16 and the terminal inner-side portion 41. The intermediate opening portion 19, along with the base opening portion 3, forms a through hole passing through the insulating layers (the base insulating layer 2 and the intermediate insulating layer 5) in the thickness direction.

A material for the intermediate insulating layer 5 is the same as that for the base insulating layer 2. The intermediate insulating layer 5 has a thickness of, for example, 1 µm or more, preferably 5 µm or more, and for example, 30 µm or less, preferably 10 µm or less.

The shield layer 6 is disposed on the other-side surface in the thickness direction of the intermediate insulating layer 5. The shield layer 6 has a pattern of being overlapped with the wire 11 and not overlapped with the terminal 13 and the mark portion 10 when projected in the thickness direction. Furthermore, the shield layer 6 has a pattern of being not overlapped with the peripheral portion 23 of the mark portion 10. A material for the shield layer 6 is the same as that for the conductive layer 4. Examples of the shield layer 6 include sputtering layer and plating layer. Preferably, a sputtering layer is used. The shield layer 6 has a thickness of, for example, 10 nm or more, preferably 30 nm or more, and for example, 1000 nm or less, preferably 500 nm or less.

The cover insulating layer 7 is disposed on the other-side surface in the thickness direction of the shield layer 6. The cover insulating layer 7 has a pattern of covering the shield layer 6. A material for the cover insulating layer 7 is the same as that for the base insulating layer 2. The cover insulating layer 7 has a thickness of, for example, 1 µm or more, preferably 5 µm or more, and for example, 30 µm or less, preferably 10 µm or less.

The metal protective layer 14 includes a one-side protective layer 25 that is disposed on the one-side surface in the thickness direction of the mark portion 10 and the one-side surface in the thickness direction of the terminal 13, and an other-side protective layer 26 that is disposed on the other-side surface in the thickness direction of the mark portion 10 and the other-side surface in the thickness direction of the terminal 13.

The one-side protective layer 25 is independently disposed on the one-side surface in the thickness direction of the alignment mark 15 and the one-side surface in the thickness direction of the terminal main body portion 40. Each of the one-side protective layers 25 is positioned at one side in the thickness direction with respect to the one-side surface 21 in the thickness direction of the base insulating layer 2, and has a thin film shape extending in the plane direction.

The one-side protective layer 25 corresponding to the alignment mark 15 forms a mark layer 27 included in the alignment mark 15 along with the mark portion 10. That is, the alignment mark 15 includes the mark portion 10 and the mark layer 27. Preferably, the alignment mark 15 consists of only the mark portion 10 and the mark layer 27.

The other-side protective layer 26 is independently disposed on the other-side surface in the thickness direction of the mark main body portion 16 and the other-side surface in the thickness direction of the terminal inner-side portion 41, and has a thin film shape along each of the surfaces thereof. Each of the other-side protective layers 26 is positioned at the inside of the intermediate opening portion 19.

Examples of the metal protective layer 14 include plating layer and sputtering layer. Preferably, a plating layer is used. Examples of a material for the metal protective layer 14 include light reflective materials and corrosion resistant materials such as gold, silver, copper, tin, aluminum, chromium, and nickel, and an alloy thereof. Preferably, gold is used.

The peripheral portion 23 of the alignment mark 15 consists of only the base insulating layer 2 and the intermediate insulating layer 5. The peripheral portion 23 has a thickness (to be specific, the total sum of the thickness of the base insulating layer 2 and the intermediate insulating layer 5) of, for example, 30 µm or less, preferably 25 µm or less, more preferably 20 µm or less, and for example, 1 µm or more, preferably 3 µm or more. When the thickness of the peripheral portion 23 is above the above-described upper limit, the thickness of the peripheral portion 23 cannot be sufficiently made thin, and thus, the light transmittance of the peripheral portion 23 cannot be sufficiently reduced. As a result, in the transmission mode, when the light is applied to the peripheral portion 23, a light amount of a second transmitting light TL2 (described later) transmitting through the peripheral portion 23 cannot be increased, and a ratio of a transmitting light amount (light amount of a first transmitting light TL1/light amount of the second transmitting light TL2) cannot be reduced. In other words, when the thickness of the peripheral portion 23 is the above-described upper limit or less, the thickness of the peripheral portion 23 can be sufficiently made thin, and thus, the light transmittance of the peripheral portion 23 can be sufficiently reduced. As a result, in the transmission mode, when the light is applied to the peripheral portion 23, the light amount of the second transmitting light TL2 transmitting through the peripheral portion 23 can be increased, and the ratio of the transmitting light amount (light amount of the first transmitting light TL1/light amount of the second transmitting light TL2) can be reduced.

The arithmetic average roughness Ra of an other-side surface 24 in the thickness direction of the intermediate insulating layer 5 in the peripheral portion 23 (that is, the other-side surface in the thickness direction of the peripheral portion 23) is, for example, 0.015 µm or less, preferably 0.01 µm or less, more preferably 0.008 µm or less, and for example, 0.001 µm or more. When the arithmetic average roughness Ra of the other-side surface 24 in the thickness direction of the intermediate insulating layer 5 is the above-described upper limit or less, in a case where the light is applied from the other side in the thickness direction, the scattering of the second transmitting light TL2 (described later) transmitting through the flat other-side surface 24 in the thickness direction of the intermediate insulating layer 5 in the peripheral portion 23 is less, and a light amount thereof can be increased.

The wiring circuit board 1 has a thickness of, for example, 50 µm or less, preferably 40 µm or less, and for example, 1 µm or more, preferably 5 µm or more.

Figure 3:
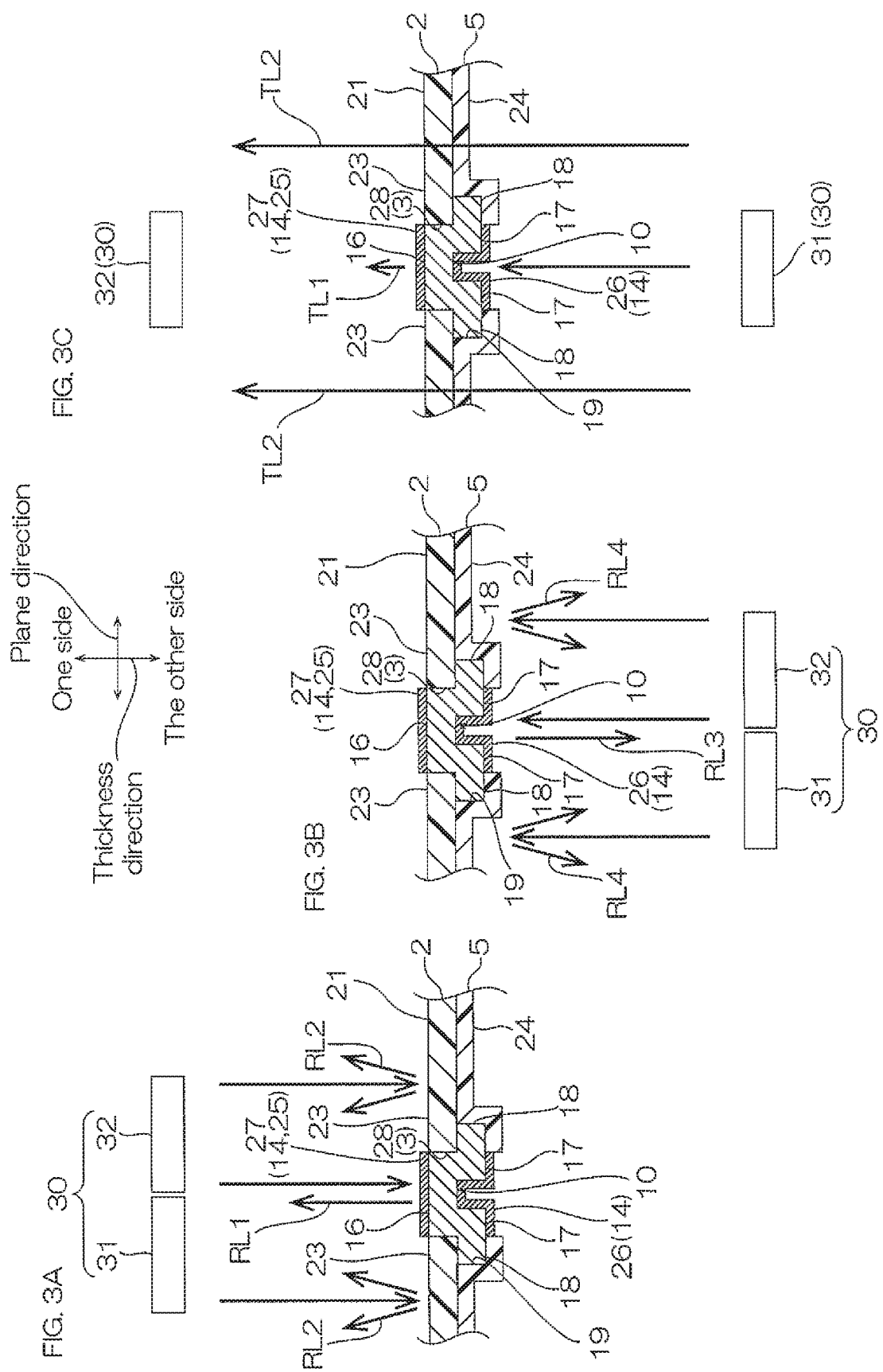
FIGS. 3A to 3C show each visibility mode of alignment of the wiring circuit board shown in FIG. 2.

As shown in FIG. 3A, in the wiring circuit board 1, when the light (for example, visible light or the like) is applied from one side in the thickness direction to the alignment mark 15 and the peripheral portion 23, a ratio of a reflective light amount (light amount of a first reflective light RL1/light amount of a second reflective light RL2) of the light amount of the first reflective light RL1 detected by being reflected on the alignment mark 15 with respect to the light amount of the second reflective light RL2 detected by being reflected on the peripheral portion 23 is, for example, 1.5 or more, preferably 2 or more, more preferably 2.5 or more, further more preferably 5 or more, and for example, 100 or less. When the ratio of the reflective light amount is the above-described lower limit or more, the visibility of the alignment mark 15 can be improved.

The above-described large ratio of the reflective light amount is, for example, achieved based on at least any one of the cases where the arithmetic average roughness Ra of the one-side surface 21 in the thickness direction of the base insulating layer 2 is large of 0.04 µm or more and where the material for the alignment mark 15 is the light reflective material such as gold (preferably, a gold plating layer) (furthermore, the case where the material for the base insulating layer 2 is the polyimide).

Both of the first reflective light RL1 and the second reflective light RL2 are the light produced by applying the light from one side in the thickness direction to the alignment mark 15 and the peripheral portion 23 to be reflected upwardly on the one-side surfaces in the thickness direction thereof. The first reflective light RL1 includes the light produced by being reflected on the one-side surface in the thickness direction of the alignment mark 15. The second reflective light RL2 includes the light produced by being reflected on the one-side surface 21 in the thickness direction of the base insulating layer 2 in the peripheral portion 23.

As shown in FIG. 3B, in the wiring circuit board 1, when the light is applied from the other side in the thickness direction to the alignment mark 15 and the peripheral portion 23, a ratio of the reflective light amount (light amount of a third reflective light RL3/light amount of a fourth reflective light RL4) of the light amount of the third reflective light RL3 detected by being reflected on the alignment mark 15 with respect to the light amount of the fourth reflective light RL4 detected by being reflected on the peripheral portion 23 is the same as the above-described ratio of the reflective light amount. Both of the third reflective light RL3 and the fourth reflective light RL4 are the light produced by applying the light from the other side in the thickness direction to the alignment mark 15 and the peripheral portion 23 to be reflected downwardly on the other-side surfaces in the thickness direction thereof. The third reflective light RL3 includes the light produced by being reflected on the other-side surface in the thickness direction of the mark layer 27. The fourth reflective light RL4 includes the light produced by being reflected on the other-side surface in the thickness direction of the intermediate insulating layer 5 in the peripheral portion 23.

Furthermore, as shown in FIG. 3C, in the wiring circuit board 1, when the light (for example, visible light or the like) is applied from the other side in the thickness direction to the alignment mark 15 and the peripheral portion 23, the ratio of the transmitting light amount (light amount of the first transmitting light TL1/light amount of the second transmitting light TL2) of the light amount of the first transmitting light TL1 detected by transmitting through the alignment mark 15 with respect to the light amount of the second transmitting light TL2 detected by transmitting through the peripheral portion 23 is, for example, 0.67 or less, preferably 0.5 or less, more preferably 0.1 or less, further more preferably 0.01 or less, and for example, 0.0001 or more. When the ratio of the transmitting light amount is the above-described upper limit or less, the visibility of the alignment mark 15 can be improved.

The above-described small ratio of the transmitting light amount is, for example, achieved based on at least any one of the cases where the peripheral portion 23 is thin, and thus, the light transmittance of the peripheral portion 23 is high, where the arithmetic average roughness Ra of the other-side surface 24 in the thickness direction of the intermediate insulating layer 5 in the peripheral portion 23 is small, so that the scattering of the second transmitting light TL2 on the flat other-side surface 24 in the thickness direction in the peripheral portion 23 is less, and where the material for the alignment mark 15 is copper (furthermore, the case where the material for the base insulating layer 2 is the transparent resin such as polyimide).

To obtain the wiring circuit board 1, for example, first, a metal supporting board (not shown) made of stainless steel or the like is prepared. Next, the base insulating layer 2, the conductive layer 4, the intermediate insulating layer 5, the shield layer 6, and the cover insulating layer 7 are sequentially formed. The arithmetic average roughness Ra of the one-side surface 21 in the thickness direction of the base insulating layer 2 is generally the same as the arithmetic average roughness Ra of the other-side surface in the thickness direction of the metal supporting board.

When the base insulating layer 2 is formed by application with respect to the other-side surface in the thickness direction of the metal supporting board, a surface shape of the other-side surface in the thickness direction of the metal supporting board that is not shown is transferred onto the one-side surface 21 in the thickness direction of the base insulating layer 2. Thus, as described above, the arithmetic average roughness Ra of the one-side surface 21 in the thickness direction of the base insulating layer 2 is generally the same as the arithmetic average roughness Ra of the other-side surface in the thickness direction of the metal supporting board.

Thereafter, the metal supporting board is, for example, removed by etching or the like, and subsequently, the metal protective layer 14 is formed. The metal protective layer 14 is formed, for example, by a thin-film forming method such as plating and sputtering, preferably by plating. More preferably, gold plating is applied, and the metal protective layer 14 is formed as a gold plating layer.

In this manner, the wiring circuit board 1 is obtained.

The use of the alignment mark 15 in the wiring circuit board 1 is not particularly limited as long as it is for the alignment. An example thereof includes alignment of the mounting component 60 (to be specific, positioning in the plane direction).

As shown in FIG. 3A, next, a method for aligning the mounting component 60 to be mounted on the wiring circuit board 1 by using the alignment mark 15 in the reflection mode (reflection mode of applying the light from one side in the thickness direction) is described.

In this method, first, the above-described wiring circuit board 1, the mounting component 60, and a detection device 30 are prepared.

The mounting component 60 has, for example, a shape extending in the plane direction, and includes a terminal 22 at the other end portion in the thickness direction. The mounting component 60 is not particularly limited, and examples thereof include imaging elements (solid imaging elements) such as CMOS sensor and CCD sensor. When the mounting component 60 is the imaging element, the wiring circuit board 1 is the wiring circuit board for mounting an imaging element. The wiring circuit board for mounting an imaging element is a board for mounting an imaging element, and though not shown, is provided in an imaging device. That is, the imaging device includes the imaging element and the wiring circuit board for mounting an imaging element.

The imaging element is small, and to be specific, has a generally flat plate shape extending in the plane direction. The imaging element has the maximum length in the plane direction of, for example, 25 mm or less, preferably 20 mm or less, more preferably 15 mm or less, and for example, 1 mm or more. The imaging element has a thickness of, for example, 1000 µm or less, preferably 800 µm or less, more preferably 500 µm or less, and for example, 50 µm or more.

The wiring circuit board 1 includes the above-described small alignment mark 15, and mounting with high accuracy by using the alignment mark 15 can be ensured, so that the imaging element is preferable as the mounting component 60.

The detection device 30 is, for example, a reflective optical sensor including an emission portion 31 and a detection portion 32.

The emission portion 31 includes, for example, a light source or the like, and emits light toward the wiring circuit board 1.

The detection portion 32 includes, for example, an optical sensor or the like, and detects the first reflective light RL1 and the second reflective light RL2 (described later).

Next, the detection device 30 and the mounting component 60 are disposed at one side in the thickness direction of the wiring circuit board 1 at spaced intervals thereto.

Subsequently, the light (for example, visible light) is applied from the emission portion 31 to the alignment mark 15 and the peripheral portion 23, and the reflective light produced on the one-side surfaces in the thickness direction thereof and going upwardly is detected in the detection portion 32. The reflective light includes the first reflective light RL1 produced by being reflected on the alignment mark 15 and the second reflective light RL2 produced by being reflected on the peripheral portion 23.

Then, as described above, the ratio of the reflective light amount of the light amount of the first reflective light RL1 with respect to the light amount of the second reflective light RL2 is large of 1.5 or more, and a contrast difference therebetween is increased. Thus, the detection device 30 can easily and accurately detect the position of the alignment mark 15 in the plane direction.

Thereafter, based on the detection of the alignment mark 15 by the detection device 30, the terminal 22 of the mounting component 60 is aligned (positioned) with respect to the one-side protective layer 25 corresponding to the terminal 13 to be brought into contact therewith, so that the mounting component 60 is mounted on the wiring circuit board 1.

Next, a method for aligning the mounting component 60 to be mounted on the wiring circuit board 1 by using the alignment mark 15 in the reflection mode (reflection mode of applying the light from the other side in the thickness direction) is described.

The detection device 30 is disposed at the other side in the thickness direction of the wiring circuit board 1.

Subsequently, the light is applied from the emission portion 31 to the alignment mark 15 and the peripheral portion 23, and the reflective light produced on the other-side surfaces in the thickness direction thereof and going downwardly is detected in the detection portion 32. In this manner, the detection device 30 can easily and accurately detect the position of the alignment mark 15 in the plane direction. Thereafter, based on the detection of the alignment mark 15 by the detection device 30, the terminal 22 of the mounting component 60 is aligned (positioned) with respect to the other-side protective layer 26 corresponding to the terminal 13 to be brought into contact therewith, so that the mounting component 60 is mounted on the wiring circuit board 1.

Furthermore, as shown in FIG. 3C, a method for aligning the mounting component 60 to be mounted on the wiring circuit board 1 by using the alignment mark 15 in the transmission mode is described.

In this method, the detection device 30 is a transmission-type optical sensor. The detection portion 32 and the emission portion 31 in the detection device 30 are disposed to face each other at spaced intervals in the thickness direction.

Next, the wiring circuit board 1 is disposed between the detection portion 32 and the emission portion 31. To be specific, the wiring circuit board 1 is set in the detection device 30 so that the cover insulating layer 7 faces the emission portion 31 (the other side in the thickness direction), and the alignment mark 15 (the one-side protective layers 25 when the alignment mark 15 is covered with one-side protective layers 25) faces the detection portion 32 (one side in the thickness direction).

Subsequently, the light (for example, visible light) is applied from the emission portion 31 to the alignment mark 15 and the peripheral portion 23, and the transmitting light that transmits through the second alignment mark 18 and the peripheral portion 23 is detected in the detection portion 32. The transmitting light includes the first transmitting light TL1 transmitting through the alignment mark 15 and the second transmitting light TL2 transmitting through the peripheral portion 23.

Then, as described above, the ratio of the transmitting light amount (light amount of the first transmitting light TL1/light amount of the second transmitting light TL2) of the light amount of the first transmitting light TL1 with respect to the light amount of the second transmitting light TL2 is small of 0.67 or less, and the contrast difference therebetween is increased. Thus, the detection device 30 can easily and accurately detect the position of the alignment mark 15 in the plane direction.

Thereafter, based on the detection of the alignment mark 15 by the detection device 30, the terminal 22 of the mounting component 60 is aligned (positioned) with respect to the one-side protective layer 25 corresponding to the terminal 13 to be brought into contact therewith, so that the mounting component 60 is mounted on the wiring circuit board 1.

In the wiring circuit board 1, the one-side surface in the thickness direction of the mark main body portion 10 of the alignment mark 15 is exposed from the base insulating layer 2. Thus, in the reflection mode in which the light is applied from one side in the thickness direction of the alignment mark 15 to the one-side surface in the thickness direction to detect the first reflective light RL1 produced on the one-side surface in the thickness direction of the mark layer 27 of the alignment mark 15, the light amount thereof can be increased compared to the light amount of the reflective light (ref: Patent Document 1) on the one-side surface in the thickness direction of the alignment mark 15 that is covered with the insulating layer (transparent layer). As a result, the visibility of the alignment mark 15 in the reflection mode is excellent.

In the wiring circuit board 1, the peripheral portion 23 consists of only the base insulating layer 2 and the intermediate insulating layer 5, and the thickness of the peripheral portion 23 is thin of 30 μm or less. Thus, in the transmission mode in which the light is applied to the peripheral portion 23 to detect the light transmitting through the peripheral portion 23, the transmittance of the light can be increased, and accordingly, the light amount of the transmitting light of the peripheral portion 23 in the transmission mode can be increased. As a result, the visibility of the alignment mark 15 in the transmission mode is excellent.

Accordingly, the wiring circuit board 1 has excellent visibility of the alignment mark 15 in both of the reflection mode and the transmission mode.

Thus, any one of the reflection mode and the transmission mode can be selected, or both modes can be also used.

In the wiring circuit board 1, both surfaces of the one-side surface and the other-side surface in the thickness direction of the mark portion 10 of the alignment mark 15 are exposed from the base insulating layer 2 and the intermediate insulating layer 5, so that the visibility of the alignment mark 15 is excellent in the reflection mode from both sides in the thickness direction.

Furthermore, in the wiring circuit board 1, the alignment mark 15 includes the mark main body portion 16, the mark inner-side portion 17, and the mark outer-side portion 18 in the above-described structure, and the terminal 13 includes the terminal main body portion 40, the terminal inner-side portion 41, and the terminal outer-side portion 42 in the above-described structure, so that the alignment mark 15 and the terminal 13 can have the same structure. As a result, position accuracy of the alignment mark 15 with respect to the terminal 13 is high, and the alignment accuracy of the mounting component 60 with respect to the terminal 13 by the alignment mark 15 can be improved.

In the wiring circuit board 1, in a case where the arithmetic average roughness Ra of the one-side surface in the thickness direction of the peripheral portion 23 is large of 0.04 μm or more, when the light is applied from one side in the thickness direction of the peripheral portion 23, the light is scattered on the rough one-side surface 24 in the thickness direction of the base insulating layer 2 in the peripheral portion 23, and the light amount of the second reflective light RL2 can be reduced. Thus, the visibility of the alignment mark 15 in the reflection mode is excellent.

In the wiring circuit board 1, when the arithmetic average roughness Ra of the one-side surface in the thickness direction of the peripheral portion 23 is small of below 0.15 μm, the thin mounting component 60 can be accurately mounted on the flat one-side surface in the thickness direction of the wiring circuit board 1.

In the wiring circuit board 1, when the shortest distance between the alignment mark 15 and the terminal 13 is short of 3 mm or less, the alignment accuracy of the mounting component 60 with respect to the terminal 13 by the alignment mark 15 is excellent.

Modified Examples

In modified examples, the same reference numerals are provided for members and steps corresponding to each of those in the one embodiment, and their detailed description is omitted. Furthermore, the modified examples can achieve the same function and effect as that of the one embodiment unless otherwise specified.

Figure 4:
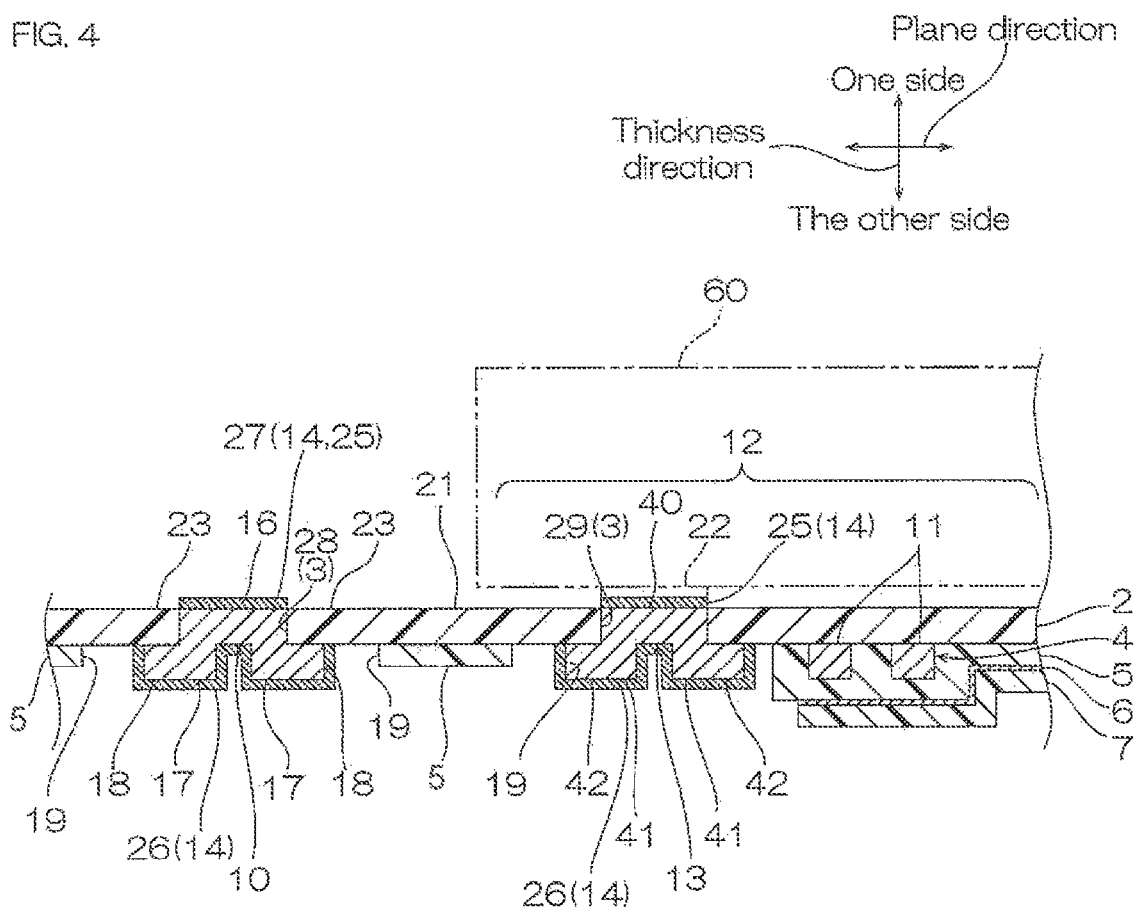
FIG. 4 shows a cross-sectional view of a modified example of a wiring circuit board of the present invention.

In FIG. 4, the mark inner-side portion 17 and the terminal outer-side portion 42 are exposed from the intermediate insulating layer 5 downwardly in the thickness direction. The other-side surfaces in the thickness direction of the mark inner-side portion 17 and the terminal outer-side portion 42 can be also covered with the other-side protective layer 26.

Figure 5:
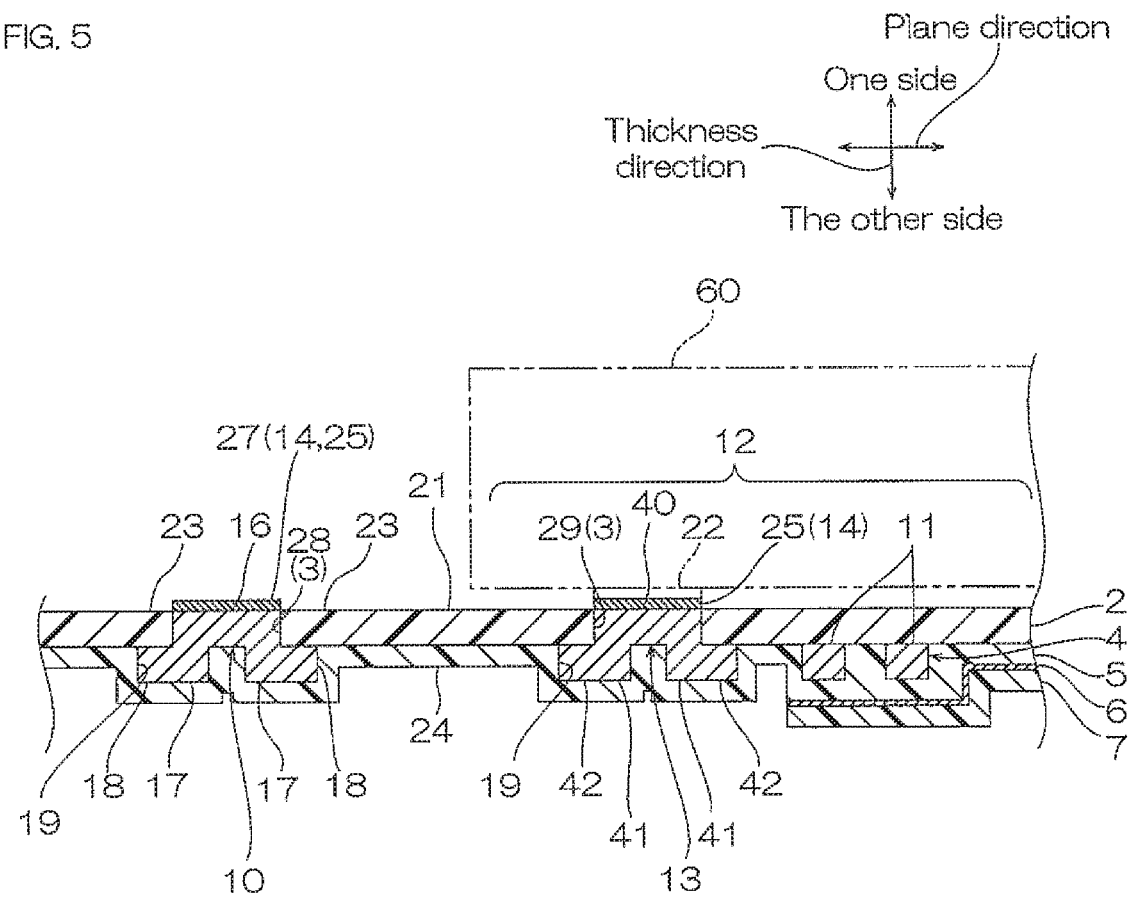
FIG. 5 shows a cross-sectional view of a modified example of a wiring circuit board of the present invention.

In FIG. 5, both of the mark inner-side portion 17 and the terminal inner-side portion 41 are directly covered with the intermediate insulating layer 5. The metal protective layer 14 does not include the other-side protective layer 26.

In FIG. 6, the mark portion 10 does not include the mark outer-side portion 18, and consists of only the mark main body portion 16 and the mark inner-side portion 17. In the modified example shown in FIG. 5, the other-side surface in the thickness direction of the mark portion 10 is covered with the intermediate insulating layer 5, and the one-side surface in the thickness direction of the mark portion 10 (to be more specific, the mark layer 27) is exposed, so that the visibility of the alignment mark 15 in the reflection mode of applying the light from one side in the thickness direction is excellent.

Although not shown, the mark inner-side portion 17 may be also provided at the other side in the thickness direction of the central portion in addition to the peripheral end portion of the mark main body portion 16.

Although not shown, as referred to FIG. 3C, in the transmission mode, the light can be also applied from one side in the thickness direction of the wiring circuit board 1.

In the one embodiment, the wiring circuit board 1 is described as the wiring circuit board for mounting an imaging element. However, the use thereof is not limited to this, and the wiring circuit board 1 can be also, for example, used for a board for inspection (anisotropic electrically conductive sheet), a flexible wiring circuit board, or the like.

The shape of the alignment mark 15 when viewed from the top is not limited to the above-described shape, and though not shown, for example, may be a generally circular shape, a generally polygonal shape (including a triangular shape and a rectangular shape), a generally L-shape (or V-shape), a generally linear shape, or a generally star-shape.

Although not shown, the number of the alignment mark 15 may be, for example, plural with respect to the one mounting region 12.

Also, the number of the alignment mark 15 may be, for example, one with respect to the plurality of mounting regions 12.

The alignment mark 15 can be also, for example, used as a dicing mark. To be specific, when an assembly sheet including the plurality of wiring circuit boards 1 is produced, and thereafter, the wiring circuit boards 1 are singulated by dicing, the alignment mark 15 is used as the dicing mark.

In the one embodiment, the arithmetic average roughness Ra of the one-side surface 21 in the thickness direction of the base insulating layer 2 is set based on the transfer of the arithmetic average roughness Ra of the other-side surface in the thickness direction of the metal supporting board. Alternatively, instead of this, for example, the arithmetic average roughness Ra of the one-side surface 21 in the thickness direction of the base insulating layer 2 can be also adjusted by surface treatment such as roughening surface treatment. In this case, after the metal supporting board is removed, the one-side surface 21 in the thickness direction of the base insulating layer 2 is subjected to surface treatment.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The wiring circuit board of the present invention is included in an imaging device.

DESCRIPTION OF REFERENCE NUMERALS

1 Wiring circuit board
2 Base insulating layer
3 Base opening portion
4 Conductive layer
5 Intermediate insulating layer
13 Terminal
15 Alignment mark
16 Mark main body portion
17 Mark inner-side portion
18 Mark outer-side portion
19 Intermediate opening portion
21 One-side surface in thickness direction of base insulating layer
23 Peripheral portion
28 First through hole
29 Second through hole
40 Terminal main body portion
41 Terminal inner-side portion
42 Terminal outer-side portion
RL1 First reflective light
RL2 Second reflective light
RL3 Third reflective light
RL4 Fourth reflective light
TL1 First transmitting light
TL2 Second transmitting light

The invention claimed is:

1. A wiring circuit board comprising:
an insulating layer,
a wire embedded in the insulating layer, and
an alignment mark electrically independent from the wire and disposed in the insulating layer so as to allow a one-side surface in a thickness direction of the alignment mark to be exposed from the insulating layer, wherein
a peripheral portion of the alignment mark consists of only the insulating layer and has a thickness of 30 μm or less, wherein
the insulating layer has a through hole passing through in the thickness direction, and
the alignment mark is disposed at the inside of the through hole, and the one-side surface and an other-side surface in the thickness direction of the alignment mark are exposed from the insulating layer so as to be exposed from the wiring circuit board.

2. The wiring circuit board according to claim 1 further comprising:
a terminal electrically connected to the wire, wherein
the insulating layer includes a base insulating layer;
the base insulating layer has a first through hole and a second through hole passing through in the thickness direction and disposed at spaced intervals to each other;
the alignment mark includes
a mark main body portion disposed at the inside of the first through hole,
a mark inner-side portion disposed at the other side in the thickness direction of the mark main body portion, and
a mark outer-side portion disposed on the other-side surface in the thickness direction of the base insulating layer so as to be continuous from the mark inner-side portion and independent from the terminal; and
the terminal includes
a terminal main body portion disposed at the inside of the second through hole,
a terminal inner-side portion disposed at the other side in the thickness direction of the terminal main body portion, and
a terminal outer-side portion disposed on the other-side surface in the thickness direction of the base insulating layer so as to be continuous from the terminal inner-side portion and electrically connected to the wire.

3. The wiring circuit board according to claim 2, wherein the shortest distance between the alignment mark and the terminal is 3 mm or less.

4. The wiring circuit board according to claim 1, wherein the arithmetic average roughness Ra of the one-side surface in the thickness direction of the peripheral portion is 0.04 μm or more.

5. The wiring circuit board according to claim 1, wherein the arithmetic average roughness Ra of the one-side surface in the thickness direction of the peripheral portion is below 0.15 μm.

* * * * *